(12) United States Patent
Park

(10) Patent No.: US 6,524,057 B1
(45) Date of Patent: Feb. 25, 2003

(54) MANUAL GUIDE VEHICLE AND METHOD FOR SUPPLYING POWER THERETO

(75) Inventor: Byung-Kwen Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/664,119

(22) Filed: Sep. 18, 2000

Related U.S. Application Data

(63) Continuation-in-part of application No. 08/824,389, filed on Mar. 26, 1997, now abandoned.

(30) Foreign Application Priority Data

Mar. 26, 1996 (KR) .............................................. 96-5874

(51) Int. Cl.⁷ .............................. B60L 11/08; H02J 7/00
(52) U.S. Cl. ...................... 414/663; 414/495; 414/940; 187/244; 312/319.5; 439/378; 403/14
(58) Field of Search ................................. 414/495, 940, 414/663; 439/378, 379, 181, 310, 374; 312/319.5, 319.7, 306, 312, 309; 108/147, 20; 318/17, 49; 307/9.1, 43; 403/13, 14

(56) References Cited

U.S. PATENT DOCUMENTS

| | | |
|---|---|---|
| 3,322,913 A | 5/1967 | Bradstock et al. |
| 4,179,178 A | 12/1979 | Bachman et al. .......... 339/111 |
| 4,210,978 A | 7/1980 | Johnson et al. ............... 15/320 |
| 4,664,590 A | 5/1987 | Maekawa ................ 414/744 R |
| 4,944,357 A | 7/1990 | Wible et al. ................. 180/169 |
| 4,998,892 A | 3/1991 | Shiley ........................ 439/381 |
| 5,125,849 A | 6/1992 | Briggs et al. ................ 439/378 |
| 5,332,013 A | 7/1994 | Sugita et al. .................. 141/98 |
| 5,356,300 A | 10/1994 | Costello et al. ............. 439/101 |
| 5,466,171 A | 11/1995 | Bixler et al. ................. 439/378 |
| 5,503,513 A | 4/1996 | Detriche ......................... 414/9 |
| 5,664,929 A | 9/1997 | Esaki et al. .................. 414/398 |

FOREIGN PATENT DOCUMENTS

| | | |
|---|---|---|
| JP | 61-211176 | 9/1986 |
| JP | 4-265602 | 9/1992 |
| JP | 4-275001 | 9/1992 |
| JP | 4-322980 | 11/1992 |
| JP | 5-91604 | 4/1993 |
| JP | 5-276605 | 10/1993 |
| JP | 6-48277 | 2/1994 |
| JP | 6-78410 | 3/1994 |
| JP | 6261424 | 9/1994 |
| JP | 6-315206 | 11/1994 |
| JP | 7-59206 | 3/1995 |

*Primary Examiner*—Christopher P. Ellis
*Assistant Examiner*—Thuy V. Tran
(74) *Attorney, Agent, or Firm*—Myers Bigel Sibley & Sajovec, P.A.

(57) ABSTRACT

A Manual Guide Vehicle for transporting semiconductor-containers to and from processing equipment is disclosed. The Manual Guide Vehicle is capable of receiving electric power for driving a transporting device for transporting cassettes with semiconductor samples to be processed from the external processing equipment.

9 Claims, 7 Drawing Sheets

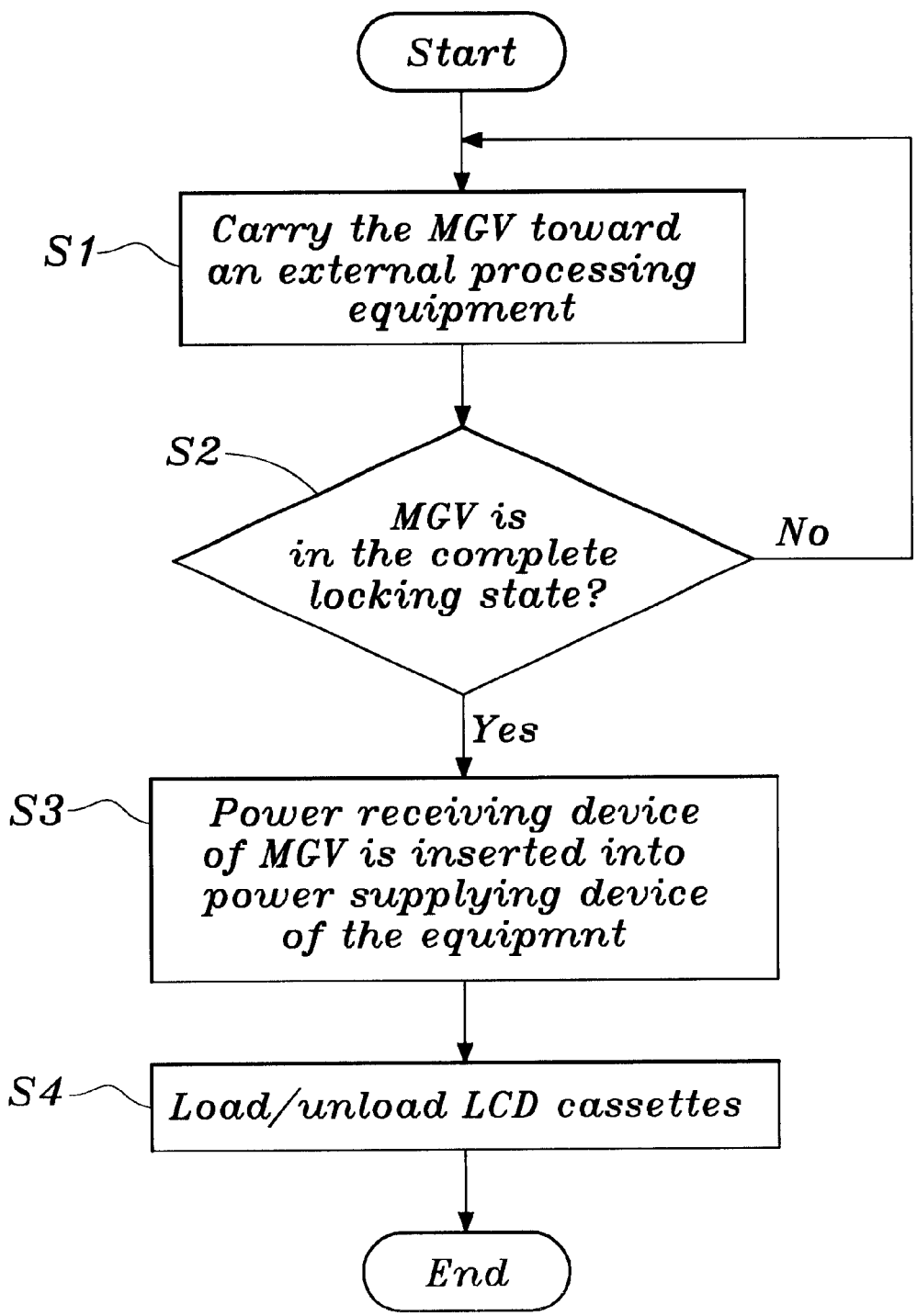

MANUAL GUIDE VEHICLE AND METHOD FOR SUPPLYING POWER THERETO

This is a continuation-in-part of application Ser. No. 08/824,389 filed, Feb. 26, 1997, now abandoned.

FIELD OF THE INVENTION

The present invention relates generally to manufacturing, and more specifically to microelectronics manufacturing.

BACKGROUND OF THE INVENTION

The fabrication of microelectronic devices such as semiconductor elements and LCD panels often involves various and repetitive processes. For example, an LCD panel is typically manufactured by submitting an LCD glass substrate to several processes including, but not limited to, a cleaning process for removing particles, a coating process for applying RGB resist and a developing process. Typically, each process is performed using equipment specific to a respective process.

A robot and the like are often configured to transport cassettes containing LCD glass substrates, as well as other semiconductor elements such as wafers, to and from the processing equipment. A robot is generally used when there are a series of programmed processes that need to be performed in a short period of time, typically without intervention. However in the event intervention is required, a robot may not be appropriate. For example, a robot is typically not used when randomly selected samples are conveyed to test equipment between the various processes for such purposes as determining whether the various equipment is functioning normally, or checking the quality of the LCD glass substrates. When unexpected errors occur in the process equipment, programmed process steps are typically unable to be successively performed. The occurrence of process equipment errors typically renders the use of robots inappropriate.

In cases where the use of a robot is inappropriate, cassettes are often conveyed by an operator via a Manual Guide Vehicle (MGV). Because cassettes containing samples often weigh between 50–60 kg, MGVs are advantageous for carrying these heavy cassettes.

A conventional MGV is shown in FIGS. 1 and 2 and is used for transporting LCD glass cassettes. In the illustrated embodiment, the MGV includes a body 17, having a generally hexagonal shape. A load frame 2, having a hexagonal shape, is positioned on top of the body 17. The height of the load frame 2 is less than the height of the body 17. The load frame 2 has a recessed part 29 on the top thereof. The recessed part 29 has an area that is larger than the area of the bottom of an LCD glass cassette 1. The recessed part 29 has a predetermined depth configured to receive a cassette 1. Formed in the center of the recessed part 29, is an aperture 30, which extends through the load frame 2 and forms an aperture 30a on the top of the body 17.

A bar 9 extends through both apertures 30 and 30a. The bar 9 has generally the same diameter as the aperture 30, and is configured to vertically reciprocate therein. The length of the bar 9 is approximately equal to the distance between the recessed part 29 and the bottom portion of the body 17, as illustrated in FIGS. 1 and 2.

The upper end of the bar 9, which extends through aperture 30a in the body 17 is connected to a support 3 and supports the LCD cassette 1, as illustrated. The lower end of the bar 9 is in contact with the bottom portion of the body 17, as illustrated. Only a portion of the bar 9 is supported within the apertures 30 and 30a, as illustrated. Accordingly, a guide 11 is installed at a predetermined location in the body 17, as illustrated. A guide aperture 12 is formed in the guide 11 for guiding the reciprocating movement of the bar 9 inserted therethrough. The guide aperture 12 has generally the same diameter as the bar 9.

The lower part of the bar 9 includes a rack 8 containing teeth on a face thereof. The teeth of the rack 8 are configured to mesh with a pinion gear 7, which is connected to a shaft extending from an electric motor 5. Rotation of the pinion gear 7 via the electric motor 5 causes the bar 9 to vertically reciprocate. The pinion gear 7 includes a lock/unlock member (not shown) for suspending the movement of the bar 9 when the bar 9 is located at a predetermined position.

Still referring to FIGS. 1 and 2, the body 17 further includes a rechargeable battery 13 which is electrically connected to the input terminal of the electric motor 5 and to a charger 15 for charging the rechargeable battery 13 on demand.

The charger 15 is supplied with voltage from an external power supply through an electrical wire. One end of the wire is connected to the charger 15 and the other end is attached to a connector(not shown), which is inserted into an outlet of the external power supply. The charger 15 generally provides Direct Current (DC) output power to the electric motor 5.

Typically, a control knob or a control panel 21 is installed on a handle 19 mounted on the body 17, as illustrated. The power supplied to the motor 5 is adjusted by operating the control knob 21. By adjusting the control knob 21 the motor 5 is selectively rotated in a positive/negative direction to thereby control reciprocation of the bar 9.

Operation of a conventional MGV for transporting cassettes with LCD glasses will now be described. First, an operator operates the control knob 21 to unload LCD glass cassettes 1 from the MGV and load them into processing equipment for performing a respective process. Operation of the control knob 21 causes direct current electrical power to be output from the battery 13, which has been charged by the charger 15 in advance, and supplied to the motor 5.

When the motor 5 is supplied with electrical power, the motor 5 begins rotating in a predetermined direction together with the shaft connected thereto. The pinion gear 7 connected to the shaft rotates in the same direction as the shaft. The rotating motion of the pinion gear 7 is transmitted to the rack 8 at the lower portion of the bar 9. The rack 8 translates the rotating motion of the pinion gear 7 into vertical reciprocating motion of the bar 9.

The rack 8 continuously moves upwardly while the motor 5 is supplied with electrical power. When an LCD cassette 1 reaches a predetermined vertical position, the operator operates the control knob 21 to cause the motor 5 to stop rotating, thereby suspending the upward movement of the LCD cassette 1 via the bar 9. The movement of the bar 9 is suspended via a ratchet which engages with the teeth of the pinion gear 7 to prevent the pinion gear 7 from further movement. The bar 9 then stops its upward movement and is not allowed to reverse its upward direction. When the LCD cassette 1 is at a predetermined height, it is either unloaded from the MGV to the processing equipment or loaded from the processing equipment to the MGV.

Referring to FIG. 3, another embodiment of a conventional MGV is illustrated. The illustrated MGV includes a charger 65 and a rechargeable battery 60 therein. The illustrated MGV includes a first motor 50 connected with vertical screws 40, rather than a rack and pinion, to move the support 70. A recessed portion 75 is formed in the support 70. In the recessed portion is installed a second motor(not shown), which is operably engaged with horizontal screws 77 for horizontally moving an LCD cassette 80. The second motor is electrically connected with the battery 60.

Conventional MGVs, such as those described above with reference to FIGS. 1, 2 and 3 may have several disadvantages. One problem is the increased weight associated therewith. Because the MGVs have a heavy rechargeable battery as well as a charger for charging the battery therein, an operator can find the MGV to be somewhat difficult to pull or push. Another disadvantage is that the rechargeable battery often requires much time to be recharged. Another disadvantage is that an operator is often required to check the charging state of the battery in order to ensure proper operation. Typically, the battery cannot output enough power to move the support vertically if not properly charged. Hence, a smooth process may not result. Still another problem with conventional MGVs is that rechargeable batteries and chargers included therein, typically increase the cost of MGVs.

SUMMARY OF THE INVENTION

It is therefore an object of the present invention to provide an MGV which can be of lighter weight than conventional MGVs and, thereby, is easier for an operator to pull and/or push.

It is another object of the present invention to eliminate the need for a rechargeable battery as a power supply.

To achieve the above and other objects of the invention, an MGV according to the present invention includes transporting means for transporting cassettes with samples to and from processing equipments, driving means for driving the transporting means, and power supplying means for supplying electrical power to the driving means. The power supplying means may include a power supplying device, installed on external equipment, for supplying an MGV with electrical power, and a power receiving device, installed in the MGV for receiving electrical power from the external equipment. The power supplying means may further include a first guide unit, installed on an MGV for guiding the power receiving device, and a second guide unit for limiting movement of the first guide unit.

An MGV configured according to the present invention is capable of receiving power for driving a cassette transporting device from external processing equipment instead of utilizing a rechargeable battery and charger system which are typically utilized in MGVs. A power receiving device having a connector portion is installed on the MGV, and a connector portion of a power supplying device is installed on the external processing equipment. The power receiving device includes a connector portion and guide pins. The connector portion includes pins configured to be inserted into the power supplying device in the external processing equipment.

An operator moves an MGV configured according to the present invention such that the power receiving device is aligned with the power supplying device in the processing equipment. Utilizing a foot lever, the operator engages the power receiving device with the power supplying device, thereby providing a continuous supply of electric power from the external processing equipment to the MGV. Operations for supplying power to an MGV for transporting cassettes to and from processing equipment, according to the present invention, therefore, include adjusting the power receiving device of an MGV to the power supplying device of external processing equipment, inserting a power receiving device into a power supplying device, and driving the driving means using power supplied therefrom.

An MGV configured according to the present invention is advantageous because it does not require a battery or a recharger. Accordingly, such an MGV is lighter in weight than MGVs with battery/recharger combinations. The lighter weight makes it easier for an operator to manipulate the MGV during microelectronic manufacturing operations. Furthermore, the MGV does not require time for charging of a battery.

BRIEF DESCRIPTION OF THE DRAWINGS

FIG. 9 is a flowchart explaining a process for supplying electrical power to an MGV according to the present invention.

DETAILED DESCRIPTION OF PREFERRED EMBODIMENTS

The present invention now is described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
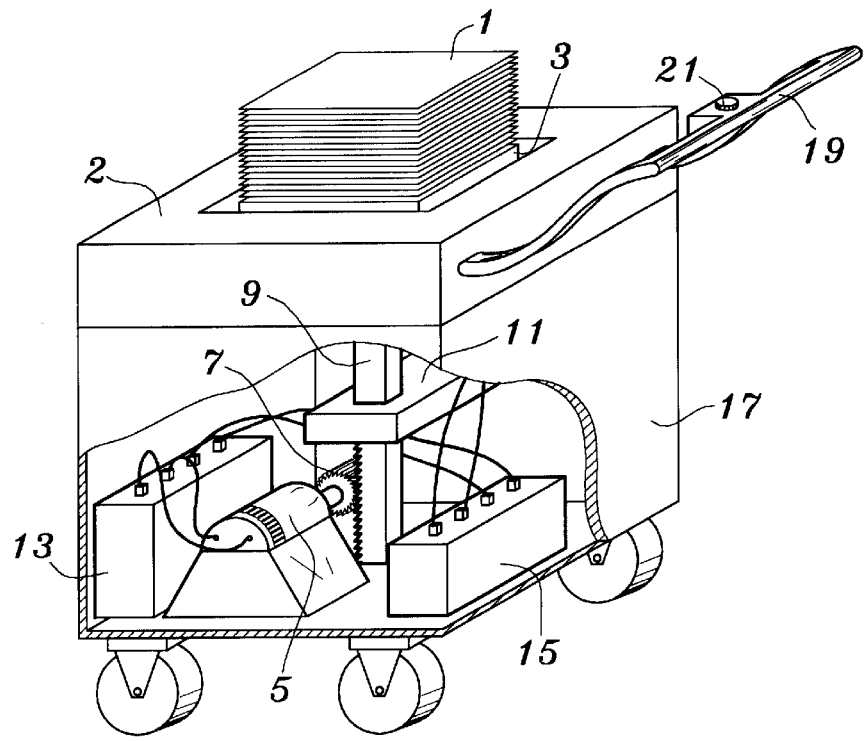
FIG. 1 is a schematic perspective view of a conventional MGV for transporting LCD cassettes with a portion cut away.
Figure 2:
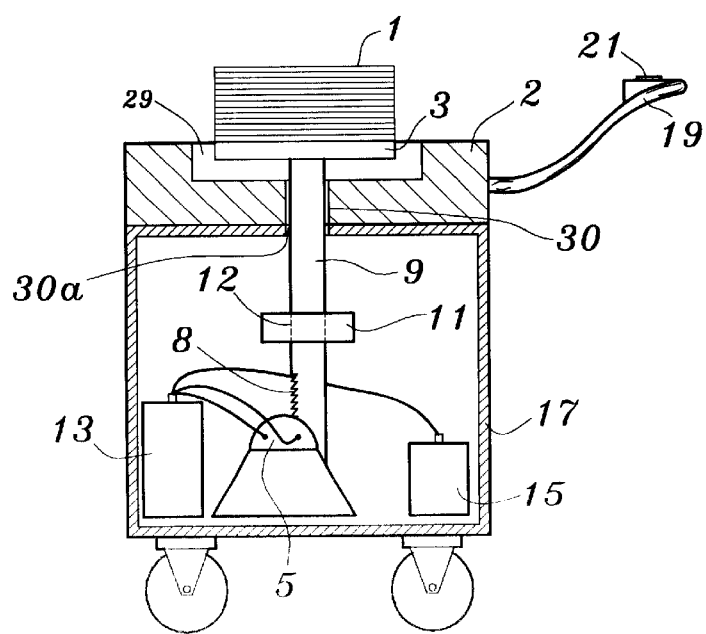
FIG. 2 is a schematic sectional of the MGV illustrated in FIG. 1.
Figure 3:
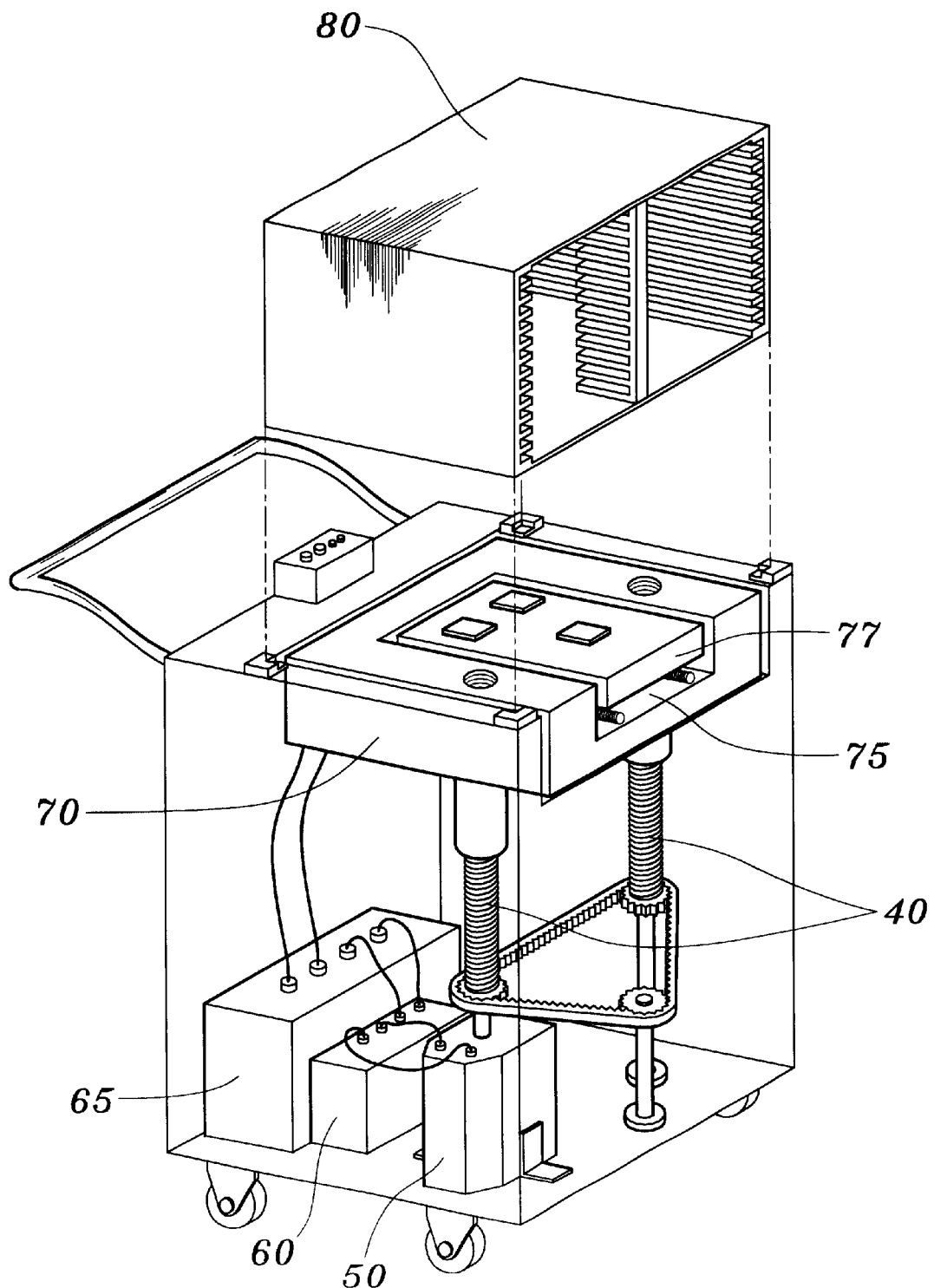
FIG. 3 is a schematic perspective view showing the interior of another conventional MGV for transporting LCD cassettes.
Figure 4:
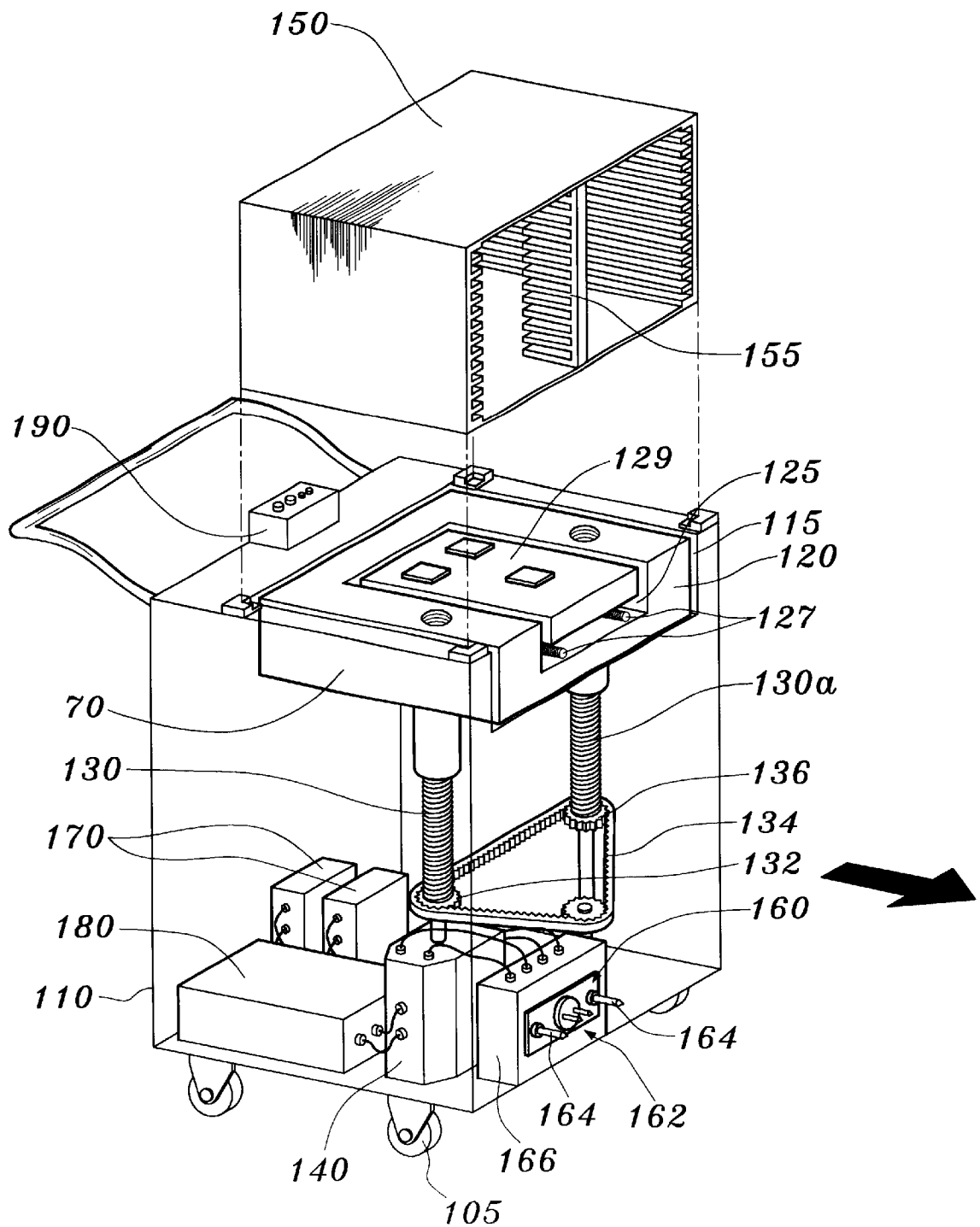
FIG. 4 is a schematic perspective view of an embodiment of an MGV according to the present invention.
Figure 5:
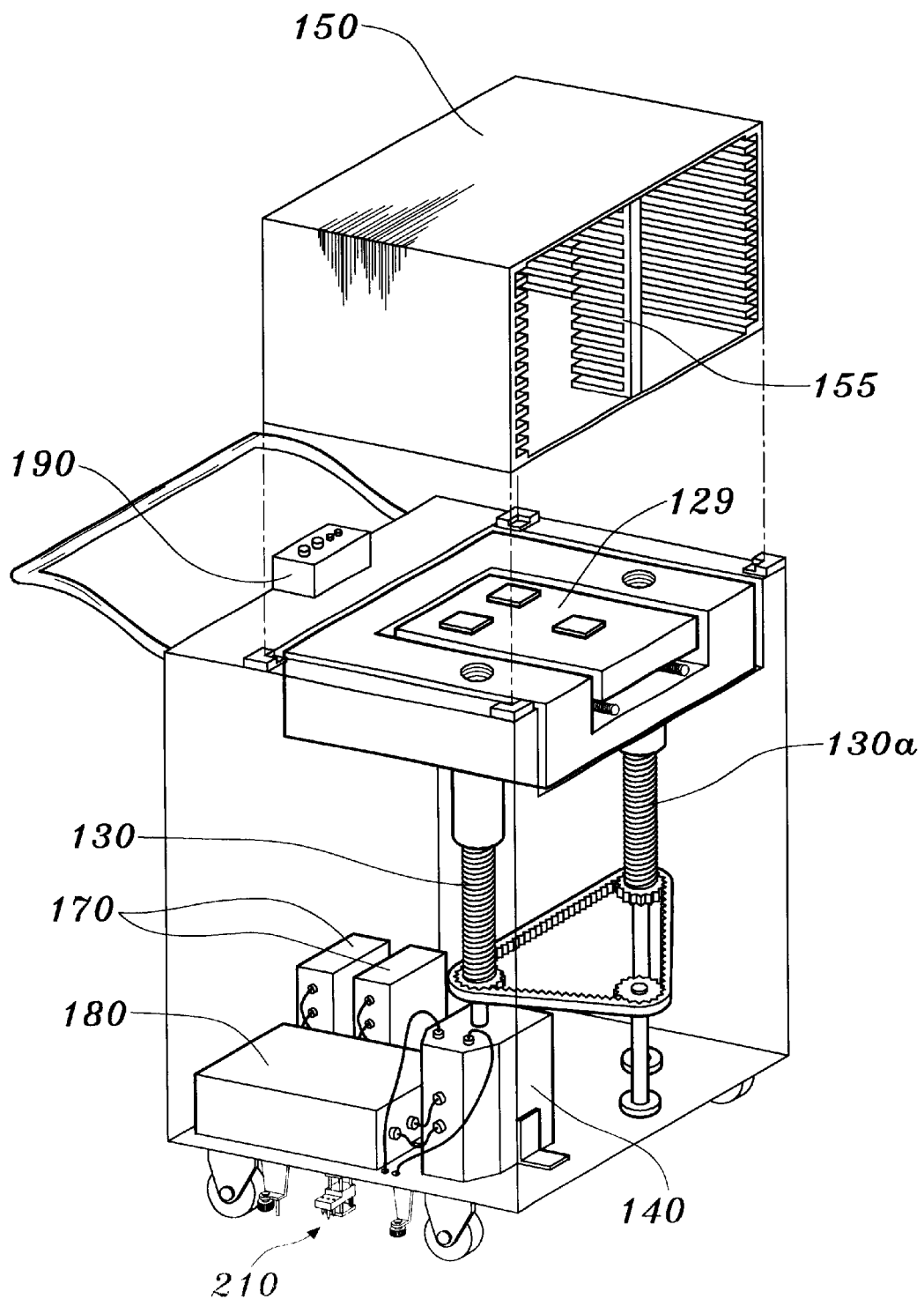
FIG. 5 is a schematic perspective view of another embodiment of an MGV according to the present invention.

An embodiment of an MGV, according to the present invention, is illustrated in FIG. 4. The MGV includes a conductive body 110 having a hexagonal shape. The body 110 has an opening 115 on a top portion thereof which is configured to receive a hexagonally-shaped support 120 for supporting an LCD cassette 150 thereon. The bottom portion of the support 120 has an area slightly smaller in size than that of the opening 115, so that the support 120 can be inserted and positioned therewithin. The bottom of the support 120 is connected to two vertical screws 130 and 130a which allow the support 120 to move up and down. A first vertical screw 130 is connected to the shaft of a first motor 140. A second vertical screw 130a is installed to prevent the support 120 from sloping to one side due to an eccentric load imposed on the side.

The first and second vertical screws 130 and 130a include a drive pulley 132 and a driven pulley 136, respectively. A belt 134 is used to connect the pulleys 132 and 136 and to transmit the rotation energy of the motor 140 thereto. When the drive pulley 132 is rotated by the operation of the motor 140, the driven pulley 136 rotates accordingly, thereby causing the support 120 to move up and down.

In the illustrated embodiment, the support 120 has a recessed portion 125. Positioned within the recessed portion 125 are a pair of horizontal screws 127 for horizontally moving the LCD cassette 150. The pair of horizontal screws 127 are engaged with a fixing unit 129 for fixing the cassette 150. Preferably, a second motor(not shown) is connected with the pair of horizontal screws 127 such that, when the second motor rotates the pair of horizontal screws 127, the fixing unit 129 moves back and forth horizontally.

As described above, the vertical movement of the support 120 is caused by the operation of the first motor 140, while the horizontal movement of the support 120 is caused by the operation of the second motor. The first and second motors are supplied with electrical power from external processing equipment through a power receiving device 160, which is installed on a side of the MGV. In the illustrated embodiment, the power receiving device 160 is located on the side of the MGV opposite from the side having the handle connected thereto.

The power receiving device 160 includes connector portion 162 and guide pins 164. The connector portion 162 has a pair of pins for receiving direct current from the external equipment. The pair of pins are configured to be inserted into a connector portion in the external processing equipment, so that direct current is input through the pair of pins. The guide pins 164 are formed on both sides of the connector portion 162 and guide the connector portion 162 when the connector portion is inserted into the connector portion of the external equipment. The guide pins help prevent the connection of the two connector portions from becoming disengaged due to vibrations, and protects them from being damaged by external forces imposed on the connectors. Preferably, the specific resistance of the guide pins 164 is low.

The power receiving device 160 is connected to a power supply 166 as illustrated. The power supply 166 is a power transducer, and includes a transformer(not shown) and a rectifier(not shown). The transformer transforms alternating current electrical power from a first voltage to a lower second voltage of a predetermined effective value. The rectifier rectifies the lower voltage alternating current electrical power to direct current electrical power.

One of the output terminals of the power supply 166, is electrically connected to the first motor 140 and to an input terminal of the second motor(not shown) via power cables. Another output terminal of the power supply 166 is connected to a motor driver 170 for driving the first and second motors, and to a control unit 180 for generating control signals to control the motor driver 170. The control unit 180 is connected to a control panel or to a control knob 190, and generates pulse signals corresponding to a function ordered by the operator.

Still referring to FIG. 4, at the bottom of the body 110 are four casters 105, or wheels, which are free to swivel and which support the MGV. The casters 105 may be made of plastic-based materials or rubber-based materials having elastic characteristics.

Another embodiment of the MGV is illustrated in FIGS. 5 to 8, wherein the power receiving device described above is installed on a side of the MGV. Except for the location of the power receiving device on the side of the MGV, all the other elements have similar locations on the MGV as described above and have basically the same functions as previously described.

Figure 6:
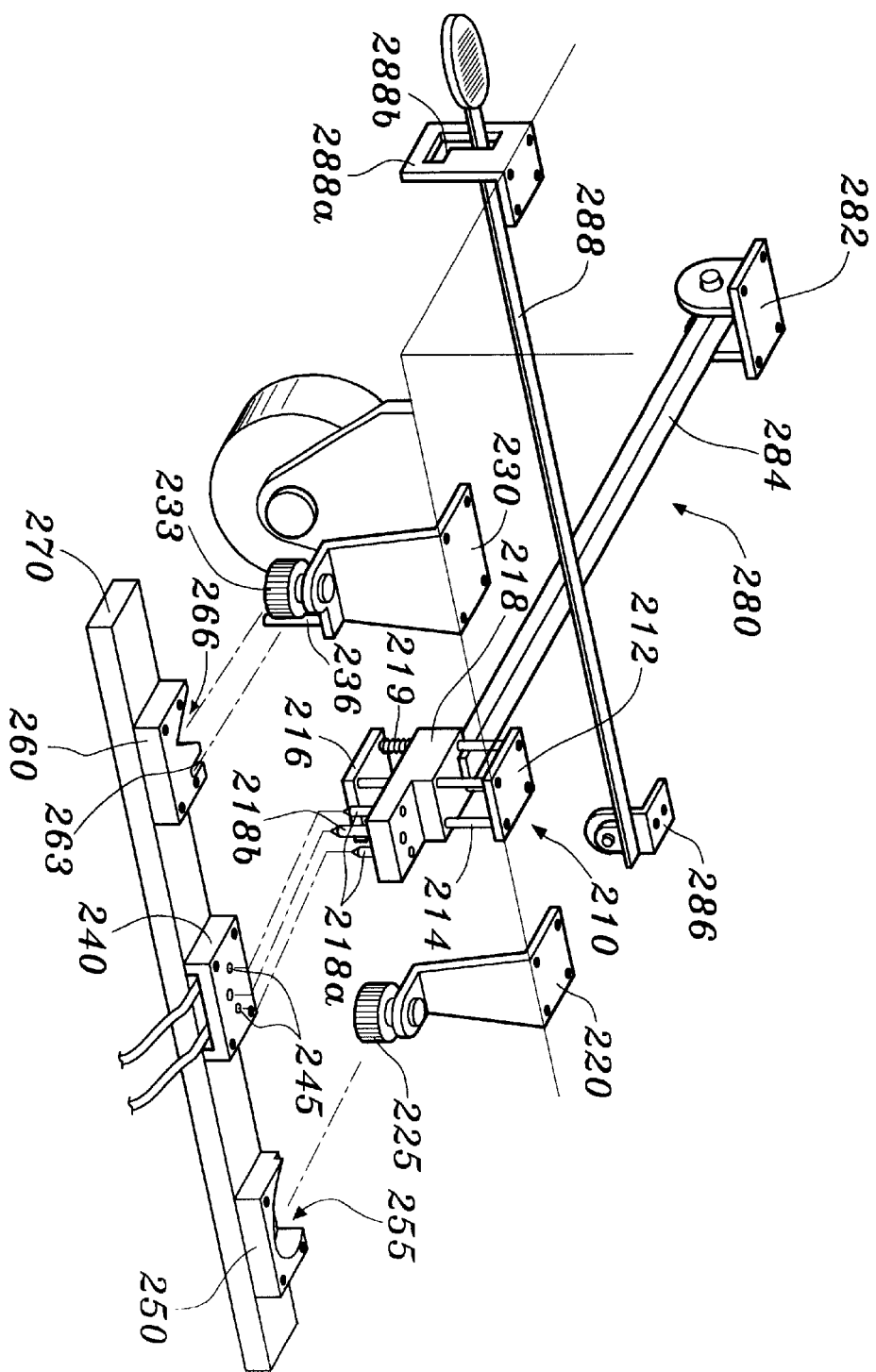
FIG. 6 is a schematic perspective view of power receiving/supplying devices for an MGV according to the present invention.

Referring now to FIG. 6, the power receiving device installed on the side of the MGV will now be described in detail. The power supplying portion of the illustrated MGV includes: a power supplying device 240 configured to be installed on external LCD processing equipment; a power receiving device 210 configured to be installed on a side of the MGV; and a pressing unit 280 for pressing the power receiving device 210 to be inserted into the power supplying device 240.

The power receiving device 210 includes: a first plate 212, which is connected to the bottom of the MGV side as illustrated; a second plate 216 opposed to the first plate 212; four slide bars 214 attached to the first plate 212 and to the second plate 216 in a direction perpendicular to the two plates; and an electrode block 218 positioned between the two plates 212 and 216. The four slide bars 214 pass through respective apertures in the electrode block 218 as illustrated.

The electrode block 218 is configured to move up and down along the slide bars 214. When the electrode block 218 moves down, the power receiving device 210 may be electrically connected to a power supplying device 240. When the electrode block 218 moves upwardly, the power receiving device 210 and power supplying devices are separated. A spring 219 may be positioned around each of the slide bars 214 between the first plate 212 and the electrode block 218, or between the second plate 216 and the electrode block 218. The springs act to push the electrode block 218 upwardly so as to separate the electrode block from the power supplying device 240.

Still referring to FIG. 6, the electrode block 218 includes two electrode pins 218a and a guide pin 218b attached to the bottom thereof. The electrode pins 218a are preferably made of a conductive material and have a predetermined length. The guide pin 218b is preferably longer than the electrode pins 218a and guides the connection of the electrode pins 218a into the power supplying device 240.

The guide pin 218b preferably is made of a material having a low electrical resistance. As a result, static electricity that may cause damage to the LCD glasses within the cassettes, may pass through the conductive body 210 of the MGV and through the guide pin 218b.

In the illustrated embodiment, a guide roller 225 and locking roller 233 are connected to the MGV by respective brackets 220 and 230 installed on a bottom portion of the MGV. The guide and locking rollers 225 and 233 are preferably located on either side of the power receiving device 210 respectively, as illustrated. One bracket 230 preferably has a pin 236, as illustrated, for double locking. The guide roller 225, the locking roller 233 and the pin 236, are collectively referred to as a first guide unit. When the MGV moves toward external processing equipment to receive electrical power, the first guide unit guides the MGV to facilitate inserting the power receiving device 210 into the power supplying device 240. It will be apparent to those having skill in the art, that apertures 245 formed in the power supplying device 240 allow the pins 218a connected to the electrode block 218 of the power receiving device 210 to be inserted therewithin, as illustrated.

A guide block 250 is positioned adjacent the power supplying device 240 as illustrated. The guide block 250 includes a first roller cavity 255 for allowing the guide roller 225 to be inserted and locked therein. A locking block 260 is positioned adjacent the power supplying device 240 on a side opposite that of the guide block 250. The locking block 260 includes a second roller cavity 266 for allowing the locking roller 233 to be inserted thereinto. When inserted into the second roller cavity 260, the locking roller 233 locks the MGV with the external processing equipment. A pin cavity 263 for receiving the pin 236 allows for double locking.

Figure 8:
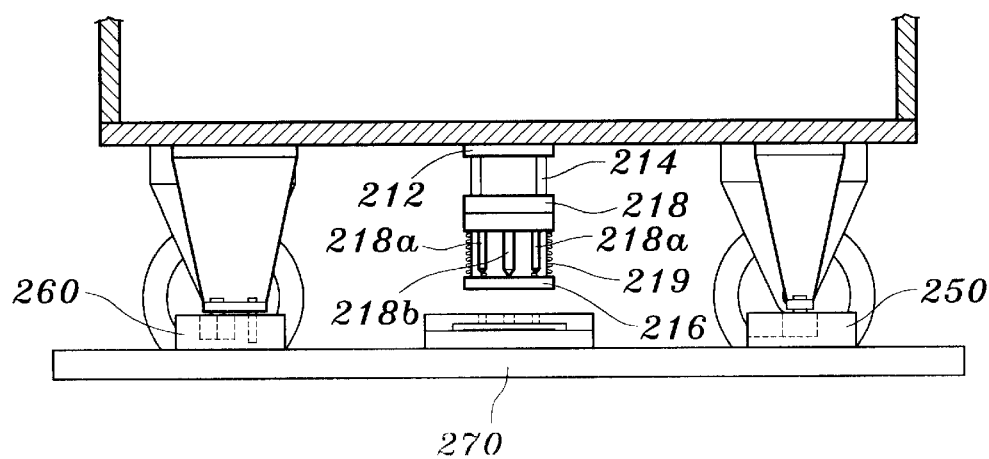
FIG. 8 is a front view of the link/release device illustrated in FIG. 7.

A bar-type support 270 supporting the guide block 250 and the locking block 260 is provided as illustrated. The support 270, the guide block 250 and the locking block 260 collectively form a second guide unit. FIG. 8 illustrates the guide block 250 and the locking block 260 in a complete locking state.

A pressing unit 280 is provided for pressing the electrode block 218 of the power receiving device 210 into the power supplying device 240. The pressing unit 280 includes a press lever 284 and a foot lever 288 in a transverse relationship. One end of the press lever 284 is laid over the electrode block 218 and is configured to press the electrode block 218 into the power supplying device 240. The opposite end of the pressing unit 280 is fixed at the bottom of the MGV with a bracket 282 attached thereto and a hinge by which the press lever 284 can pivot. A foot lever 288 is installed over the press lever 284 in a direction perpendicular to the press lever 284. An end of the foot lever 288 is also fixed at the bottom of the MGV with a bracket 286 attached thereto and a hinge by which the foot lever 284 can also pivot. The opposite end of the foot lever 288 extends to the back side of the MGV, namely the side on which the handle(not shown) is installed, and extends outwardly from the bottom of the MGV.

When the foot lever 288 is pressed by the operator, the press lever 284 and the electrode block 218 are pressed downwardly. When the electrode block 218 is pressed by the press of the operator into the power supplying device 240, power is supplied from the external processing equipment through the power supplying device and into the power receiving device 210. In the illustrated embodiment, a lever bracket 288a is attached to the side of the MGV and is configured such that the foot lever 288 extends therethrough. The lever bracket 288a includes a locking lug 288b formed therein for maintaining the foot lever 288 in a "pressed-down" state. In operation, the foot lever is moved downwardly and into the locking lug 288b. When the foot lever 288 is maintained in the pressed-down state, power is continuously supplied from the external processing equipment to the MGV.

A common feature of the aforementioned embodiments of the present invention is that an MGV is structured to receive power for driving the first and the second motors therein from external processing equipment. Both embodiments include a power receiving device having a connector portion installed on the MGV, and a connector portion installed on the external processing equipment; and guide pins. The guide pins preferably have low resistance.

The guide pins are important in that they prevent the LCD glasses from shaking and from being damaged by static electricity generated in the MGV. Preferably, the LCD glass cassette to be loaded on the MGV is at least partially made of a conductive material to facilitate removing static electricity.

Cassettes for loading large scale LCD glasses generally includes LCD glass support (indicated as reference numeral 155 in FIG. 5) for supporting the glasses. The glass support 155 prevents the glasses from bending under their own weight. The LCD glass support is generally made of a conductive material. As a result, the static electricity in the glasses can be grounded by the LCD glass support as well as the guide pin.

Referring now to FIG. 9, a flowchart illustrates operations for supplying an MGV with power from external processing equipment. Initially, an operator moves an MGV toward external LCD processing equipment (Step S1) so that LCD cassettes with LCD glasses therein can be processed. Next, the operator inserts the guide roller 225 of the first guide unit into the guide block 250 of the second guide unit to be locked. A determination is made whether the MGV is in the complete locking state (Step S2). If only the guide roller 225 is inserted into the first roller cavity 255 of the guide block 250, the locking state is incomplete. Therefore, the locking roller 233 and the locking pin 236 of the first guide unit are inserted into the second roller cavity 266 and the pin cavity 263 of the locking block 260 of the second guide unit, respectively. The MGV is then completely locked with the external equipment.

Figure 7:
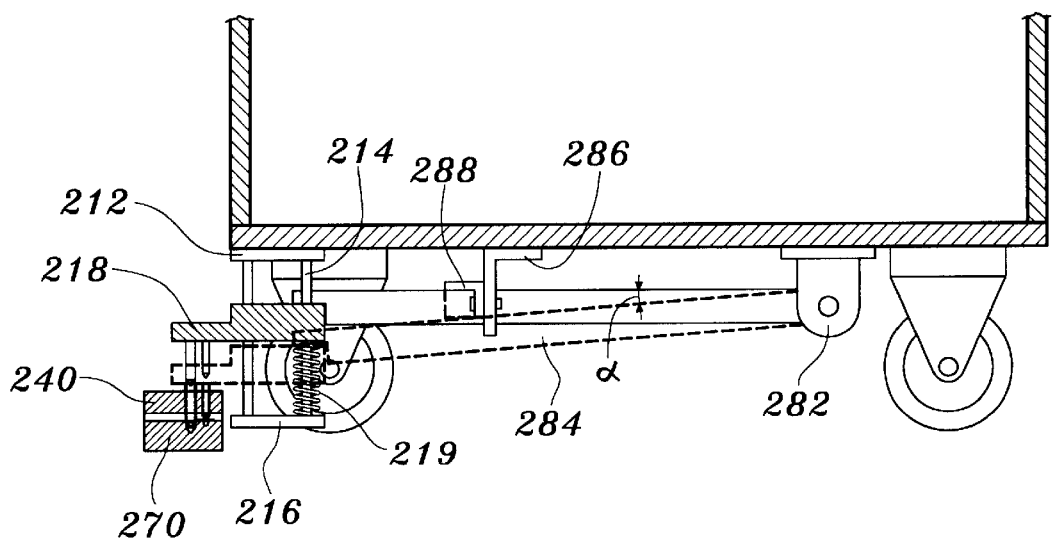
FIG. 7 is a side view of a link/release device according to the present invention.

Once the MGV is in a complete locking state, the operator presses the foot lever 288 of the pressing unit 280. Referring to FIG. 7, the position of the foot lever 288 is illustrated. The dashed line of the press lever 284 shows the foot lever 288 in the pressed-down position, while the solid line shows the foot lever 288 in the released position. When the foot lever 288 is pressed, the electrode block 218 of the power receiving device 210 of the MGV is pressed downwardly. As a result, the electrode pins 218a of the electrode block 218 are inserted into the holes 245 of the power supplying device 240 (Step S3).

Once the power receiving device is connected to the power supplying device, the operator moves the foot lever 288 to the locking lug 288b of the lever bracket 288a in order to maintain a continuous supply of electric power. Electric power supplied from the equipment is passed through the power receiving device 210 and is converted to power capable of driving the first and second motor of the MGV. The converted power is sent to the first and the second motors in the MGV, the control unit 180, and the motor driver 170. Thereafter, the operator operates the control knob 190 or the control panel.

Responsive to the operation of the operator, the control knob generates signals, which are transmitted to the control unit 180. The control unit 180 processes the signals and inputs the processed signals to the motor driver 170. According to the signals from the control unit, the motor driver 170 generates signals for driving the first and the second motors. The first and the second drivers are operated by the signals from the motor driver 170. The LCD glass cassettes are moved from the MGV to the equipment or from the equipment to the MGV by the operation of the motors (Step S4).

As described above, the MGV according to the present invention is capable of receiving power for motors for driving a cassette transporting device from an external processing equipment instead of utilizing a rechargeable battery and charger system which are typically utilized in MGVs. The present invention is advantageous because an MGV configured according to the present invention may be lighter in weight and does not require time for charging of a battery. As a result MGV efficiency is enhanced.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, That which is claimed is:

1. A manual guide vehicle comprising:
   transporting means for transporting cassettes with a plurality of samples to be processed;
   driving means for driving the transporting means; and
   a power supplying interface portion for supplying the driving means with electric power from external processing equipment, the power supplying interface portion comprising:
   a power receiving device, installed on the manual guide vehicle and which cooperates with a power supplying device installed on external processing equipment, that receives electric power from the processing equipment when inserted into the power supplying device, the power receiving device comprising:
   a first plate on the manual guide vehicle;
   at least one slide bar having opposing first and second ends, the first end of which is perpendicularly connected to the first plate;
   a second plate connected to the second end of the slide bar;
   an electrode block, inserted in the slide bar, for moving up and down between the first and the second plates;
   a spring inserted in the slide bar between the first plate and the electrode block or between the second plate and the electrode block;
   a first guide unit which guides the power receiving device; and
   a second guide unit which guides and limits the movement of the first guide unit.

2. The manual guide vehicle of claim 1, wherein the power supplying device includes corresponding electrode apertures for receiving a pair of conductive electrodes therein.

3. The manual guide vehicle of claim 1, wherein the electrode block includes:
   a pair of conductive electrodes which vertically extend therefrom; and
   an electrode guide pin, which is longer than the pair of conductive electrodes and has a low electrical resistance, disposed between the pair of conductive electrodes.

4. The manual guide vehicle of claim 1, wherein the electrode block vertically reciprocates in response to pressing means operation.

5. The manual guide vehicle of claim 4, wherein the pressing means for the electrode block includes:
   a press lever having first and second opposing ends, the first end of which is laid over the electrode block and the second end of which is fixed at the bottom of the manual guide vehicle with a bracket and a hinge for enabling the press lever to pivot;
   a foot lever, installed over the press lever in a direction perpendicular to the press lever, for vertically moving to press the press lever.

6. The manual guide vehicle of claim 5, wherein vertical movement of the foot lever is limited by foot lever locking means.

7. The manual guide vehicle of claim 6, wherein the foot lever locking means includes a foot lever locking lug.

8. A manual guide vehicle comprising:
   transporting means for transporting cassettes with a plurality of samples to be processed;
   driving means for driving the transporting means; and
   a power supplying interface portion for supplying the driving means with electric power from external processing equipment, the power supplying portion comprising:
   a power receiving device, installed on the manual guide vehicle and which cooperates with a power supplying device installed on external processing equipment, that receives electric power from the processing equipment when inserted into the power supplying device;
   a first guide unit which guides the power receiving device, the first guide unit comprising a guide roller, a locking roller for fixing the position of the guide roller and a locking pin; and
   a second guide unit which guides and limits the movement of the first guide unit.

9. A manual guide vehicle comprising:
   transporting means for transporting cassettes with a plurality of samples to be processed;
   driving means for driving the transporting means; and
   a power supplying interface portion for supplying the driving means with electric power from external processing equipment, the power supplying portion comprising:
   a power receiving device, installed on the manual guide vehicle and which cooperates with a power supplying device installed on external processing equipment, that receives electric power from the processing equipment when inserted into the power supplying device;
   a first guide unit which guides the power receiving device; and
   a second guide unit which guides and limits the movement of the first guide unit, the second guide unit comprising:
   a guide cavity for insertion of a guide roller;
   a locking roller cavity for insertion of a locking roller; and
   a locking cavity for insertion of a locking pin.

* * * * *